(12) United States Patent
Yen (10) Patent No.: US 10,234,488 B2
(45) Date of Patent: Mar. 19, 2019

(54) HAND TOOL FOR CURRENT SENSING

(71) Applicant: Chao-Chin Yen, New Taipei (TW)

(72) Inventor: Chao-Chin Yen, New Taipei (TW)

(*) Notice: Subject to any disclaimer, the term of this patent is extended or adjusted under 35 U.S.C. 154(b) by 99 days.

(21) Appl. No.: 15/487,702

(22) Filed: Apr. 14, 2017

(65) Prior Publication Data

US 2018/0301880 A1 Oct. 18, 2018

(51) Int. Cl.
*B25B 13/00* (2006.01)
*G01R 19/15* (2006.01)
*H02G 1/12* (2006.01)
*B25B 7/02* (2006.01)
*B25B 7/22* (2006.01)

(52) U.S. Cl.
CPC .............. *G01R 19/15* (2013.01); *B25B 7/02* (2013.01); *B25B 7/22* (2013.01); *H02G 1/1204* (2013.01)

(58) Field of Classification Search
USPC ............... 81/82, 472, 479, 9.41, 9.42, 9.43
See application file for complete search history.

(56) References Cited

U.S. PATENT DOCUMENTS

| | | | | |
|---|---|---|---|---|
| 6,164,106 A * | 12/2000 | Nghiem | ............... | B21D 39/04 29/720 |
| 6,895,836 B2 * | 5/2005 | Hetland | ............... | H02G 1/1212 81/44 |
| 7,468,674 B2 * | 12/2008 | Onachilla | ............... | H02G 1/005 340/660 |
| 7,827,638 B1 * | 11/2010 | Klick | ............... | B26B 13/16 7/127 |
| 9,059,573 B2 * | 6/2015 | Hedrick | ............... | H01R 43/0421 |
| 10,033,166 B2 * | 7/2018 | Yen | ............... | H02G 1/1212 |
| 2008/0309347 A1 * | 12/2008 | Kurtz | ............... | B25B 7/00 324/522 |
| 2014/0020513 A1 * | 1/2014 | Yen | ............... | H02G 1/1273 81/9.41 |

* cited by examiner

*Primary Examiner* — Joseph J Hail
*Assistant Examiner* — Shantese McDonald
(74) *Attorney, Agent, or Firm* — Chun-Ming Shih; HDLS IPR Services (57) ABSTRACT

A hand tool for current sensing includes a body (110) and a current sensing module (200). The body (110) includes two clamping handles (120) pivotally connected by a pivot (130), two pliers jaws (140) disposed at respective one ends of the two clamping handles (120) respectively, and a clamping structure (150) disposed at the two pliers jaws (140). The current sensing module (200) is detachably coupled to any of the pliers jaws (140) and is arranged adjacent to the clamping structure (150). The current sensing module (200) includes an alert unit (220) for sending out an alert signal. Accordingly, an operator can sense whether a cable carries a current by means of the hand tool, thus ensuring safety of the operator during work.

12 Claims, 7 Drawing Sheets

FIG.7 the present invention relates to a hand tool and, in particular, to a hand tool for sensing whether a cable/wire contacted carries a current, so as to ensure safety of an operator.

HAND TOOL FOR CURRENT SENSING

TECHNICAL FIELD

The present invention relates to a hand tool and, in particular, to a hand tool for sensing whether a cable/wire contacted carries a current, so as to ensure safety of an operator.

BACKGROUND

Commonly-used wire stripping tools include wire strippers and art knifes. Before stripping an insulation layer from a wire which carries current, an operator chooses a suitable wire stripper according to different types and specifications of the wire. Stripping operations are typically performed on, for example, wires, telephone lines, network cable or other electric wires, so as to connect them to equipment like transformers, adapters and network socket. However, it is time consuming, inefficient, and labor intensive to complete stripping operations, and the quality of the stripping operations is unstable, leading to inferior connection at times.

Furthermore, during repairing or checking electrical wiring or network equipment, the operator may receive an electrical shock and may be injured when it is inconvenient to use a current detector due to work environment or when the operator tries to directly use the wire stripper to repair the electric wire carrying little or large current. Besides, it is time consuming and highly inconvenient to use a multimeter to detect current. If the wire stripper is capable of detecting current, it will enable the operator to detect current conveniently and alert the operator when needed to ensure safety.

In views of this, in order to solve the above disadvantage, the present inventor studied related technology and provided a reasonable and effective solution in the present disclosure.

SUMMARY

It is an object of the present invention to provide a hand tool for sensing current, which senses whether current is present on a wire/cable during maintenance of the wire/cable, so as to ensure safety of operators.

Accordingly, the preset invention provides a hand tool for sensing current. The hand tool includes a body and a current sensing module. The body includes two clamping handles pivotally connected by a pivot, two pliers jaws disposed at respective one ends of the two clamping handles, and a clamping structure disposed at two pliers jaws. The current sensing module is detachably coupled to any of the pliers jaws and is disposed adjacent to the clamping structure, and the current sensing module includes an alert unit for sending out an alert signal.

The present invention further has the following functions. When a sensor senses a current or an electrical field, the alert unit can alert the operator by a light emitting diode and/or a buzzer installed in the alert unit, so that the operator is protected from electrical hazards like electrical shocks, thus enhancing safety and convenience and work efficiency during maintenance/repair procedures. In addition, the current sensing module further includes a contact type or non-contact type sensor, so the operator does not need to touch or directly touch the cable/conductive material to detect current; configurations and designs may vary according to requirement.

The current sensing module is detachably assembled to another side (a back side) of the two pliers jaws opposite to the clamping structure. Therefore, the current sensing module does not inhibit or affect operations of the clamping structure, and each component in the current sensing module can be repaired or replaced easily and conveniently through unfastening screws or other fastening elements.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
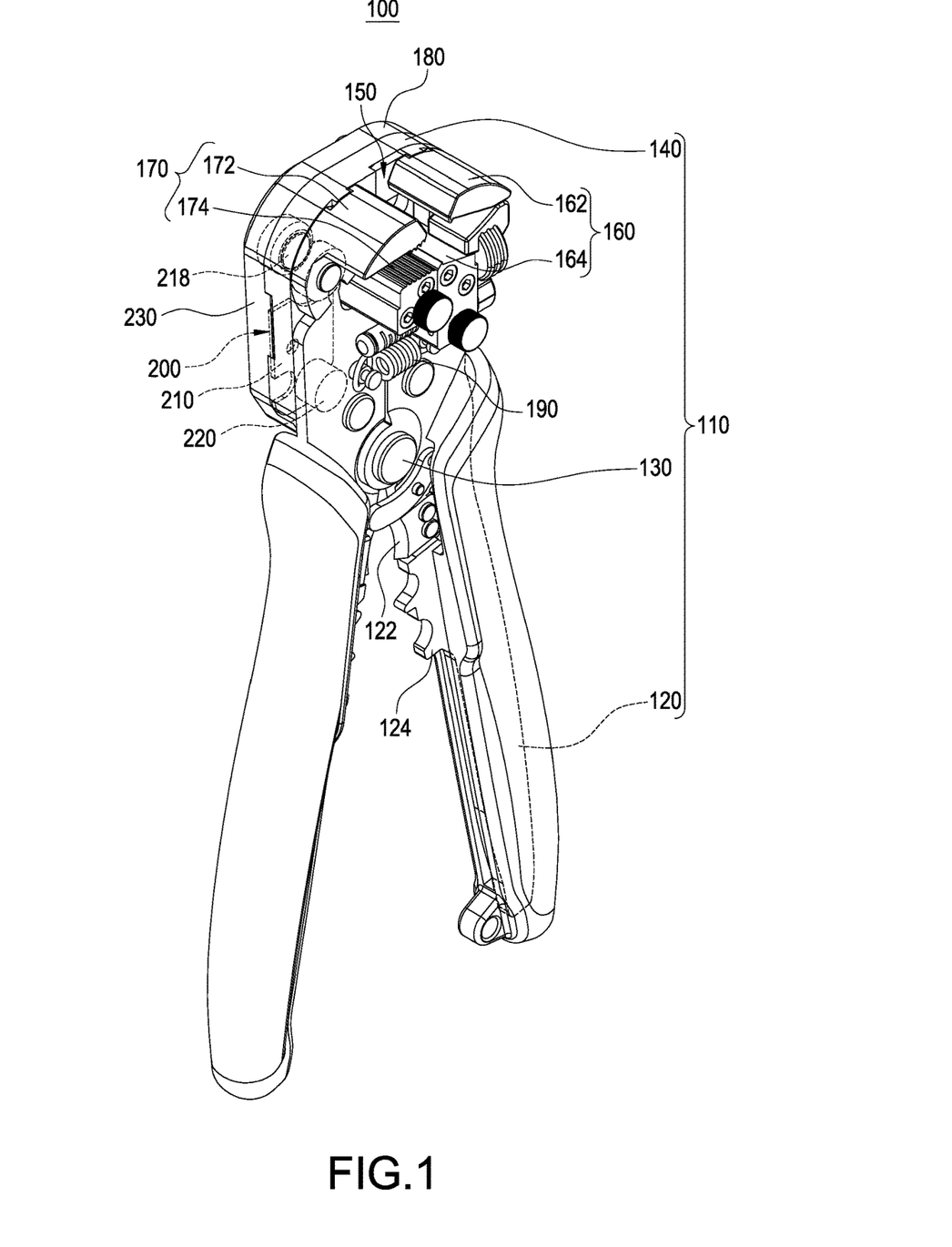
FIG. 1 is a perspective view showing a hand tool for current sensing according to the present invention.
Figure 2:
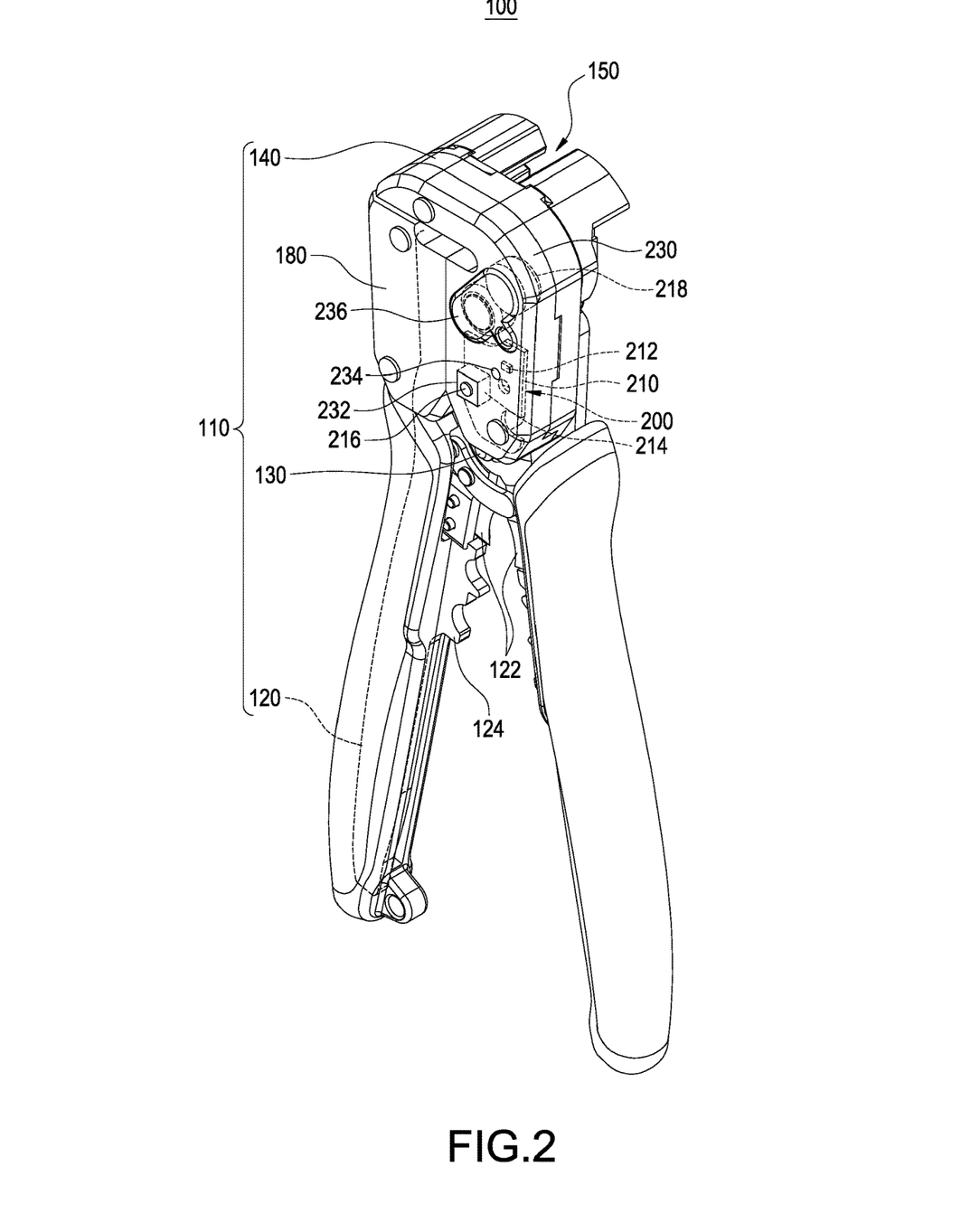
FIG. 2 is another perspective view showing the hand tool for current sensing.
Figure 3:
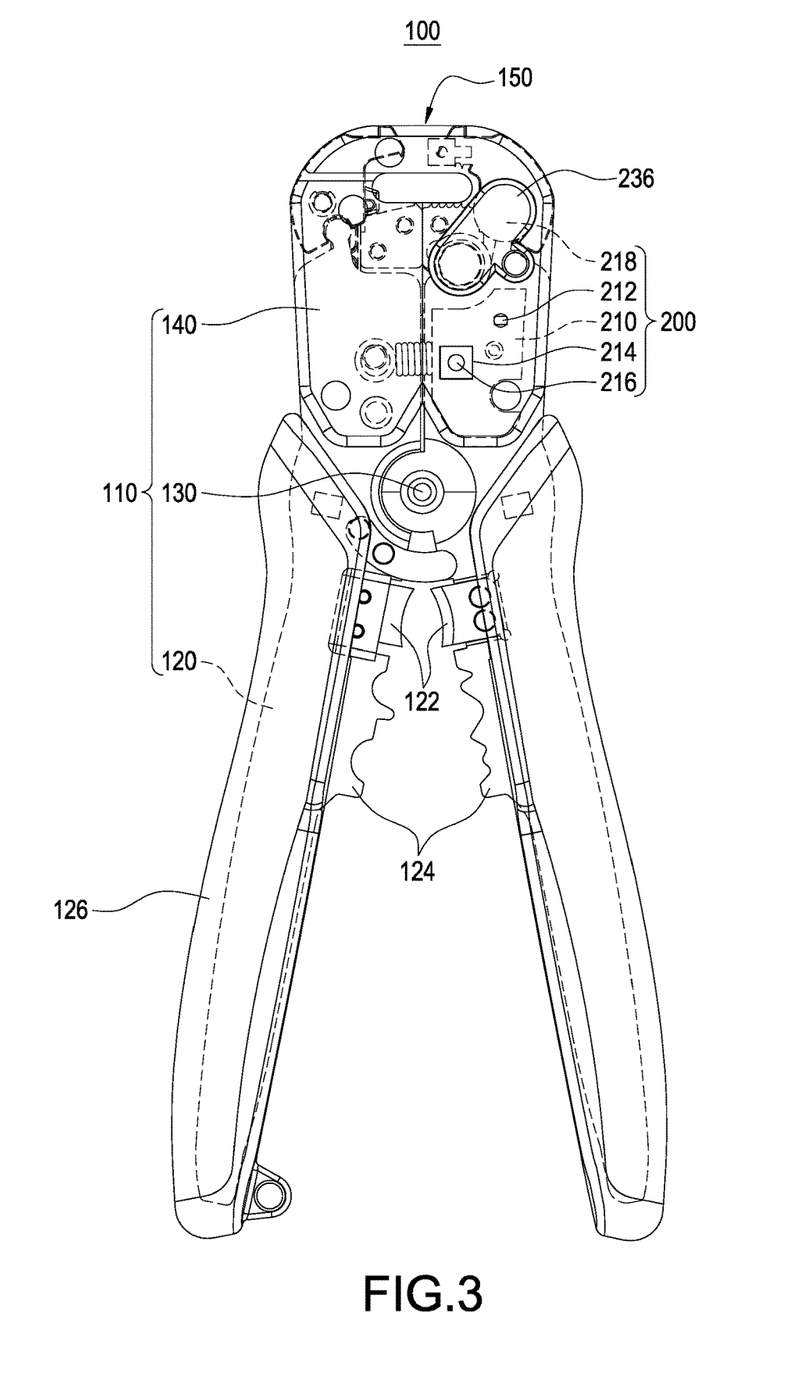
FIG. 3 is a side view showing the hand tool for current sensing.

Referring to FIGS. 1 to 3, the present invention provides a hand tool 100 for current sensing, comprising a body 110 and a current sensing module 200. The hand tool 100 is preferably a wire stripper, a crimper pliers, a wire cutter, an electrician's pliers or other suitable pliers.

The body 110 includes two clamping handles 120 pivotally connected by means of a pivot 130, two pliers jaws 140 disposed at respective one ends of the two clamping handles 120, and a clamping structure 150 disposed at the two pliers jaws 140. As shown in FIGS. 1 to 3, the clamping structure 150 is preferably disposed at one side of the two pliers jaws 140, and includes a cutting assembly 160 and a clamping assembly 170 disposed at the two pliers jaws 140 respectively, the cutting assembly 160 is adapted to cutting operations and includes a movable cutter 162 and a fixed cutter base 164, and the clamping assembly 170 is used to clamp and includes a movable clamp 172 and a fixed clamp base 174.

By means of the cutting assembly 160 and the clamping assembly 170, the clamping structure 150 of the hand tool 100 can strip an insulation layer from a cable/wire (not illustrated). However, in different embodiments, the clamping structure 150 may include different cutting tool assemblies for cutting, bending, twisting wires or performing other operations, and the present invention is not limited in this regard.

In the embodiment shown in FIG. 3, the two clamping handles 120 are respectively covered by two coverings 126 made from an insulation material, thereby preventing electric shock to an operator and achieving easy gripping and anti-slip effect.

In the present embodiment, the hand tool 100 further includes two blade assemblies 122 disposed at two corresponding lateral sides of the two clamping handles 120 respectively, a wire compressing assembly 124 disposed below and adjacent to each blade assembly 122, a first spring 190 connected to two ends of the two pliers jaws 140, and a second spring 192 disposed at another side opposite to the first spring 190. The blade assembly 122 can perform cut-off or other operations on wires/cables. The wire compressing assembly 124 can compress or grib wires/cables of various diameters. The first spring 190 and the second spring 192 can be, but not limited to, compression springs, torsion springs or other suitable elastic elements.

As shown in FIG. 1, two ends of the first spring 190 are fixed to the two pliers jaws 140 respectively, so that the two pliers jaws 140 are opened or closed by means of an elastic restoring force of the first spring 190, and thereby the blade assembly 122 and the wire compressing assembly 124 can perform cutting operations. Furthermore, as shown in FIG. 3, the second spring 192 is disposed at another side of the two pliers jaws 140 opposite to the first spring 190, and the second spring 192 assists the first spring 190 in providing the two pliers jaws 140 sufficient elastic restoring force, so that it is easy and labor-saving to operate the hand tool 100.

When the operator does not apply any force yet, the second spring 192 (i.e. the first spring 190) is not biased and is in a compressed state. At this point, the two clamping handles 120 are in an open state like an opened shears. That is to say, the blade assembly 122 and the wire compressing assembly 124 are also in the open state, so that wires/cables can be inserted between the blade assemblies 122 or the wire compressing assemblies 124 to cut off, cut or compress the wires/cables. When the operator exerts force, the second spring 192 (i.e. the first spring 190) is biased to stretch and is in a stretched state. At this point, the two clamping handles 120 are closed, the blade assembly 122 or the wire compressing assembly 124 can perform aforesaid various operations on the wires/cables inserted between the blade assemblies 122 or the wire compressing assemblies 124.

Figure 4:
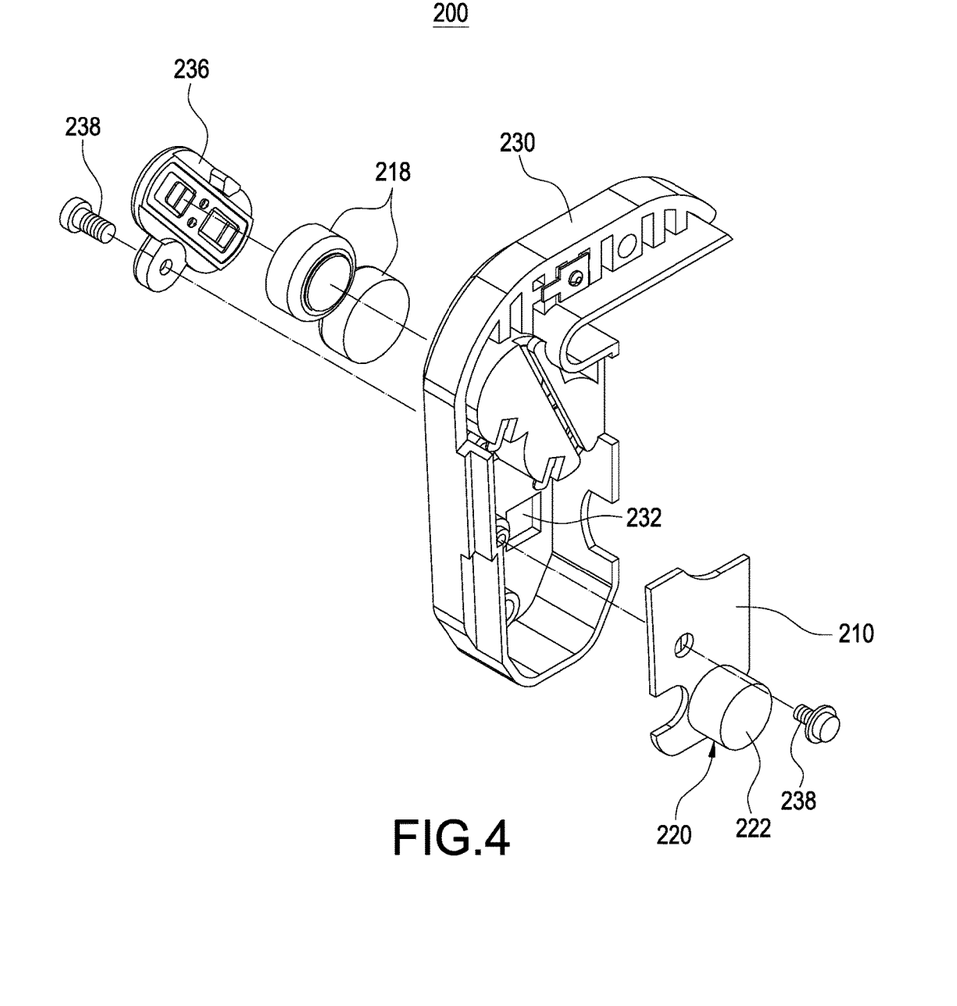
FIG. 4 is an exploded view showing a current sensing module according to the present invention.
Figure 5:
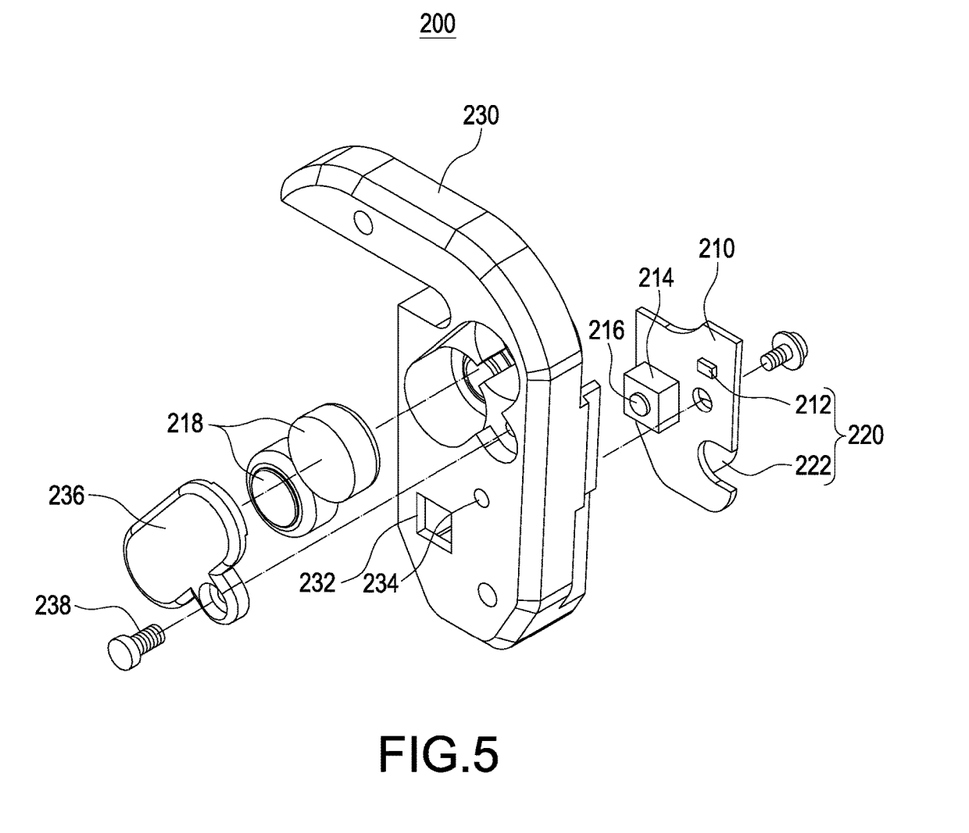
FIG. 5 is an exploded view from another viewing angle, showing the current sensing module according to the present invention.

Referring to FIGS. 4 and 5, the current sensing module 200 is detachably coupled to any one of the pliers jaws 140 and is disposed adjacent to the clamping structure 150. The current sensing module 200 includes an alert unit 220 for sending out an alert signal (e.g. light, sound, or a combination thereof). However, in different embodiments, the current sensing module 200 can be disposed on any clamping handle 120; configurations may vary as required.

In the present embodiment, the alert unit 220 is preferably a light emitting diode 212 and/or a buzzer 222. The alert signal (not illustrated) is light emitted by the light emitting diode 212 and/or sound emitted by the buzzer 222 for signaling the operator immediately to ensure safety. As shown in FIG. 4 or FIG. 5, in the embodiment, the current sensing module 200 includes a circuit board 210, and includes the alert unit 220 and a sensor 214 which are electrically connected to the circuit board 210. The current sensing module 200 includes a circuit board 210, a housing 230 covering the circuit board 210, the alert unit 220, the sensor 214, a switch 216, and at least one power supply 218. The alert unit 220, the sensor 214, the switch 216 and the at least one power supply 218 are electrically connected to the circuit board 210.

As shown in the drawings, the hand tool 100 further includes a cover 236 detachably assembled to the housing 230, and includes a plurality of fastening elements 238 fastening the circuit board 210 and the cover 236 to the housing 230, wherein the cover 236 positions the power supply 218. The operator can easily repair or replace the current sensing module 200 or each component in the current sensing module 200 by unfastening the fastening elements 238 like screws or other similar fastening elements. The housing 230 includes an opening 232 corresponding to the switch 216. The operator can control turning on or turning off of the alert unit 220 (particularly, the switch 216) via the opening 232. In addition, the operator can directly observe the light emitted by the light emitting diode 212 via a hole 234 disposed corresponding to the alert unit 220, and thus the operator can be reminded or alerted.

The switch 216 shown in FIG. 5 is preferably a press-type switch or a touch switch or other suitable switch. There are preferably multiple power supplies 218, as shown in FIGS. 4 and 5. The power supply 218 is preferably a button cell battery, a dry battery, a rechargeable battery, or other suitable battery; the present invention is not limited in this regard.

Moreover, the sensor 214 is preferably arranged together with the switch 216. However, in other different embodiments, the sensor 214 can be a built-in component of the circuit board 210, or can be disposed at any place on the circuit board 210, or can be electrically connected to the circuit board 210 and disposed at any place in the body 110; the present invention is not limited in this regard. The sensor 214 includes, but not limited to, a wireless sensor or a contact sensor. The wireless sensor is, for example, an infrared sensor, a radio sensor, an optical sensor. The contact sensor is, for example, an electromagnetic sensor or a current sensor. The detecting principles of the aforesaid sensors are conventional techniques, so a detailed description thereof is omitted herein for brevity.

Figure 6:
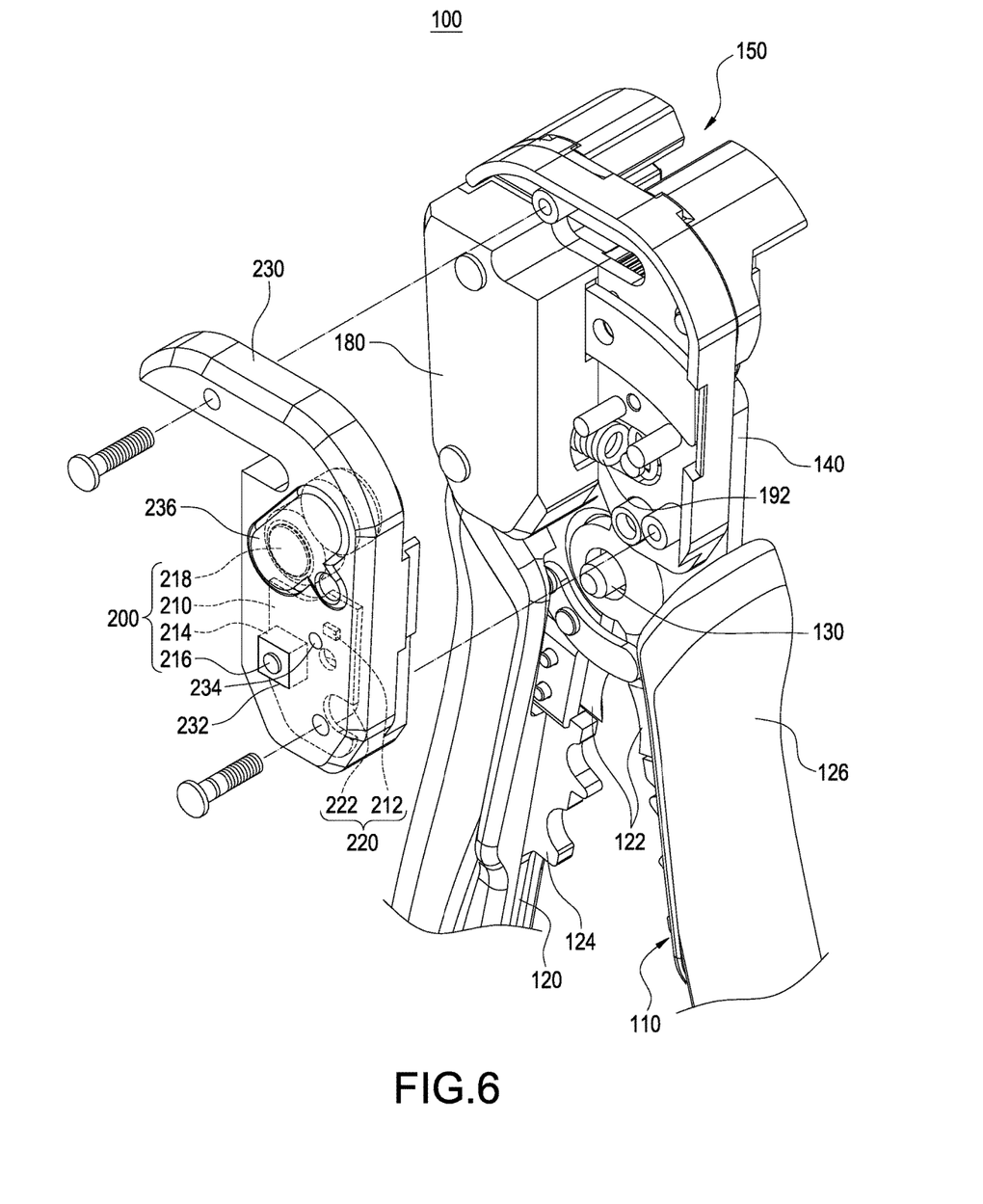
FIG. 6 is an exploded view showing the current sensing module and a body according to the present invention.
Figure 7:
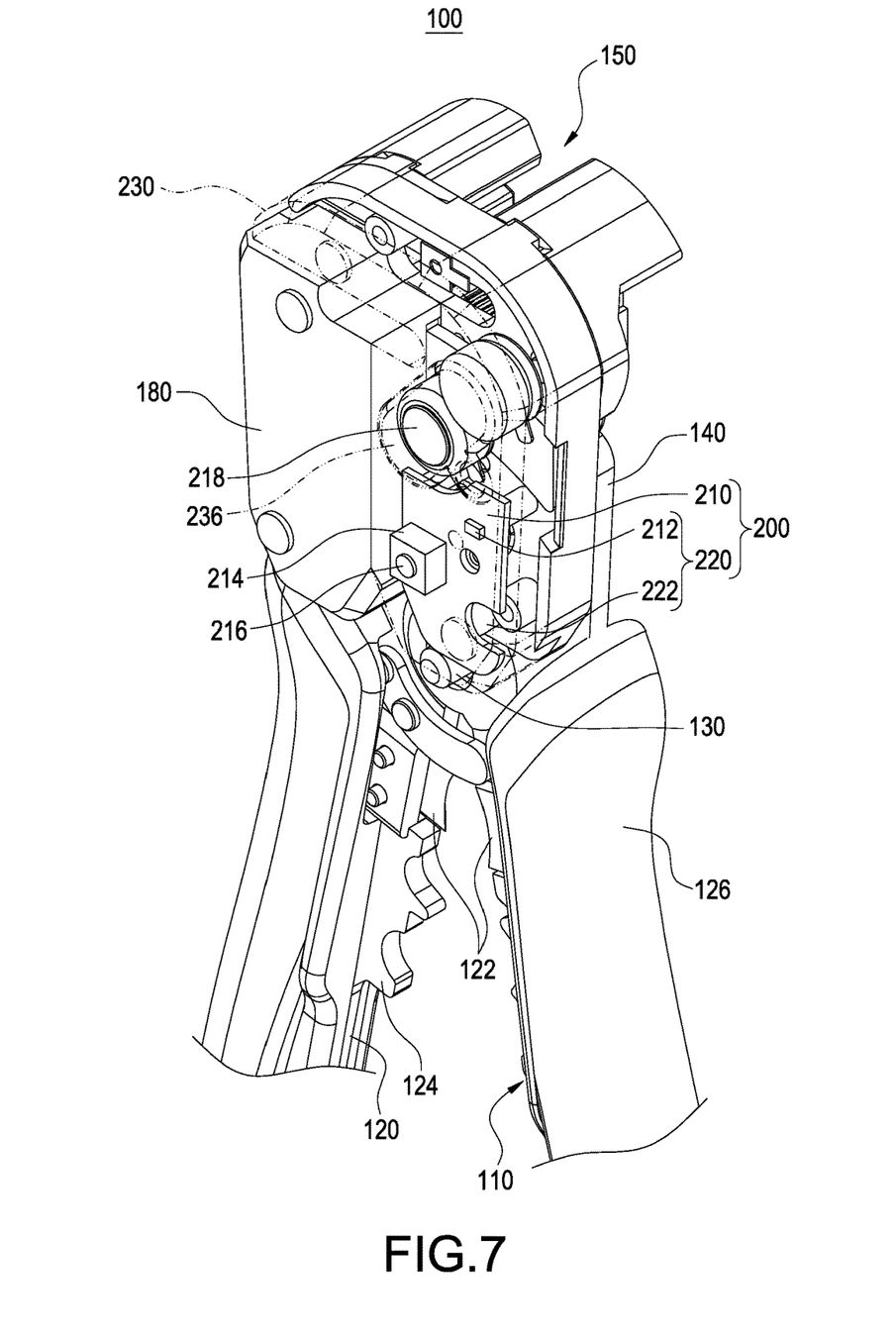
FIG. 7 is an assembled view based on FIG. 6.

Referring to FIGS. 6 and 7, the hand tool 100 includes a jaw base 180 coupled to any of the pliers jaws 140 and is disposed adjacent to the clamping structure 150, wherein the current sensing module 200 is juxtaposed with the jaw base 180 at one side thereof. That is to say, the current sensing module 200 is disposed at another side of the two pliers jaws 140 opposite to the cutting assembly 160 (the movable cutter 162 and the fixed cutter base 164) and the clamping assembly 170 (the movable clamp 172 and the fixed clamp base 174).

When the operator with the hand tool 100 approaches wire/cable (not illustrated) carrying current or having electric field. The sensor 214 of the current sensing module 200 detects the current or electric field in a wireless manner or in a contact manner. The alert unit 220 sends out the alert signal to alert the operator. In the present embodiment, it is preferable that the alert unit 220 emits light from the light emitting diode 212 or emits sound from the buzzer 214. Therefore, the operator can be alerted immediately to avoid touching the wire/cable inadvertently, thus ensuring safety of the operator.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:
1. A hand tool (100) for current sensing, comprising:
a body (110) including two clamping handles (120) pivotally connected by a pivot (130), two pliers jaws (140) disposed at respective one ends of the two clamping handles (120), and a clamping structure (150) disposed at the two pliers jaws (140); and a current sensing module (200) detachably coupled to any of the pliers jaws (140) and disposed adjacent to the clamping structure (150), the current sensing module (200) including an alert unit (220) for sending out an alert signal, wherein the current sensing module (200) includes a circuit board (210), and includes the alert unit (220) and a sensor (214) which are electrically connected to the circuit board (210).

2. The hand tool (100) for current sensing according to claim 1, wherein the sensor (214) is a wireless sensor or a contact sensor.

3. The hand tool (100) for current sensing according to claim 1, wherein the alert unit (220) is a light emitting diode (212) and/or a buzzer (222), and the alert signal is light emitted by the light emitting diode (212) and/or sound emitted by the buzzer (222).

4. The hand tool (100) for current sensing according to claim 1, further comprising a jaw base (180) coupled to any of the pliers jaws (140) and disposed adjacent to the clamping structure (150), wherein the current sensing module (200) is juxtaposed with the jaw base (180) at one side thereof.

5. The hand tool (100) for current sensing according to claim 1, wherein the clamping structure (150) is disposed at one side of the two pliers jaws (140), and includes a cutting assembly (160) and a clamping assembly (170) disposed at the two pliers jaws (140) respectively, the cutting assembly (160) includes a movable cutter (162) and a fixed cutter base (164), and the clamping assembly (170) includes a movable clamp (172) and a fixed clamp base (174).

6. The hand tool (100) for current sensing according to claim 1, further comprising two blade assemblies (122) disposed at two corresponding lateral sides of the two clamping handles (120) respectively, a wire compressing assembly (124) adjacent to each blade assembly (122), a first spring (190) connected to two ends of the two pliers jaws (140), and a second spring (192) disposed at another side opposite to the first spring (190).

7. A hand tool (100) for current sensing, comprising:
a body (110) including two clamping handles (120) pivotally connected by a pivot (130), two pliers jaws (140) disposed at respective one ends of the two clamping handles (120), and a clamping structure (150) disposed at the two pliers jaws (140); and a current sensing module (200) detachably coupled to any of the pliers jaws (140) and disposed adjacent to the clamping structure (150), the current sensing module (200) including an alert unit (220) for sending out an alert signal, wherein the current sensing module (200) includes a circuit board (210), a housing (230) covering the circuit board (210), the alert unit (220), a sensor (214), a switch (216), and at least one power supply (218), and the alert unit (220), the sensor (214), the switch (216) and the at least one power supply (218) are electrically connected to the circuit board (210).

8. The hand tool (100) for current sensing according to claim 7, wherein the sensor (214) is a wireless sensor or a contact sensor.

9. The hand tool (100) for current sensing according to claim 7, further comprising a cover (236) detachably assembled to the housing (230), and comprising a plurality of fastening elements (238) fastening the circuit board (210) and the cover (236) to the housing (230), wherein the cover (236) positions the at least one power supply (218).

10. The hand tool (100) for current sensing according to claim 7, wherein the housing (230) includes an opening (232) disposed corresponding to the switch (216) and includes a hole (234) disposed corresponding to the alert unit (220).

11. The hand tool (100) for current sensing according to claim 7, wherein the switch (216) is a press-type switch or a touch switch.

12. The hand tool (100) for current sensing according to claim 7, wherein the power supply (218) is a battery or a rechargeable battery.

* * * * *